(12) United States Patent
Ko et al.

(10) Patent No.: US 9,070,645 B2
(45) Date of Patent: Jun. 30, 2015

(54) ORGANIC LIGHT EMITTING DIODE DISPLAY

(75) Inventors: Hee-Joo Ko, Yongin (KR); Chang-Ho Lee, Yongin (KR); Il Soo Oh, Yongin (KR); Se-Jin Cho, Yongin (KR); Hyung-Jun Song, Yongin (KR); Jin-Young Yun, Yongin (KR); Jong-Hyuk Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 511 days.

(21) Appl. No.: 12/929,996

(22) Filed: Mar. 1, 2011

(65) Prior Publication Data

US 2011/0240964 A1 Oct. 6, 2011

(30) Foreign Application Priority Data

Mar. 31, 2010 (KR) ........................ 10-2010-0029419

(51) Int. Cl.
| | | |
|---|---|---|
| *H01L 51/54* | (2006.01) | |
| *H01L 27/32* | (2006.01) | |
| *H01L 51/50* | (2006.01) | |

(52) U.S. Cl.
CPC ........ *H01L 27/3248* (2013.01); *H01L 51/5088* (2013.01); *H01L 51/5092* (2013.01)

(58) Field of Classification Search
CPC ............ H01L 27/3248; H01L 51/5088; H01L 51/5092; H01L 51/50; H01L 51/54; H05B 33/14; C09K 11/06
See application file for complete search history.

(56) References Cited

U.S. PATENT DOCUMENTS

| | | | | |
|---|---|---|---|---|
| 5,739,545 | A * | 4/1998 | Guha et al. ...................... | 257/40 |
| 5,998,803 | A * | 12/1999 | Forrest et al. ................... | 257/40 |
| 7,049,741 | B2 * | 5/2006 | Madathil et al. ............... | 313/504 |
| 2002/0125820 | A1 * | 9/2002 | Sheu et al. ..................... | 313/505 |
| 2003/0042846 | A1 * | 3/2003 | Forrest et al. ................. | 313/503 |
| 2003/0230980 | A1 | 12/2003 | Forrest et al. | |
| 2004/0061435 | A1 | 4/2004 | Liao et al. | |
| 2004/0222737 | A1 * | 11/2004 | Raychaudhuri et al. ...... | 313/504 |

(Continued)

FOREIGN PATENT DOCUMENTS

| | | | |
|---|---|---|---|
| JP | 11-026156 | A | 1/1999 |
| JP | 11-260562 | A | 9/1999 |

(Continued)

OTHER PUBLICATIONS

Chen, et al.; Stable inverted bottom-emitting organic electroluminescent devices with molecular doping and morphology improvement; Applied Physics Letters; 2006; pp. 053518-1-053518-3; 89-053518; American Institute of Physics; United States.

*Primary Examiner* — Dawn L. Garrett
(74) *Attorney, Agent, or Firm* — Lee & Morse, P.C.

(57) ABSTRACT

An organic light emitting diode (OLED) display including a substrate main body; a thin film transistor on the substrate main body; and an organic light emitting diode including a transparent electrode connected with the thin film transistor and being capable of injecting electrons, an organic emission layer on the transparent electrode, and a reflective electrode on the organic emission layer and being capable of injecting holes, wherein the organic emission layer includes an electron injection unit on the transparent electrode, the electron injection unit including an electron injection metal layer, an electron injection layer, and an electron injection dipole layer, and a light emitting unit on the electron injection unit.

16 Claims, 5 Drawing Sheets

(56) References Cited

U.S. PATENT DOCUMENTS

| | | | |
|---|---|---|---|
| 2005/0007316 A1* | 1/2005 | Akimoto et al. | 345/76 |
| 2006/0234410 A1* | 10/2006 | Chen | 438/45 |
| 2006/0279190 A1* | 12/2006 | Nakayama | 313/113 |
| 2007/0114916 A1* | 5/2007 | Chang et al. | 313/504 |
| 2007/0159080 A1* | 7/2007 | Han et al. | 313/505 |
| 2007/0228942 A1* | 10/2007 | Akai et al. | 313/504 |
| 2007/0252155 A1* | 11/2007 | Cok | 257/79 |
| 2009/0011278 A1* | 1/2009 | Choi et al. | 428/690 |

FOREIGN PATENT DOCUMENTS

| | | |
|---|---|---|
| JP | 2004-139798 A | 5/2004 |
| JP | 2005-165324 A | 6/2005 |
| JP | 2006-114903 A | 4/2006 |
| JP | 2006-202709 A | 8/2006 |
| JP | 2006-269228 A | 10/2006 |
| JP | 2007-173179 A | 7/2007 |
| JP | 2008-034367 A | 2/2008 |
| JP | 2008-059824 A | 3/2008 |
| JP | 2008-277101 A | 11/2008 |
| JP | 2009-016332 A | 1/2009 |
| JP | 2009-200493 A | 9/2009 |
| JP | 2009-206512 A | 9/2009 |
| KR | 10 2006-0012120 A | 2/2006 |
| KR | 10 2006-0066829 A | 6/2006 |
| KR | 10-0805270 B1 | 2/2008 |
| WO | WO 2008/029103 * | 3/2008 |

* cited by examiner

ORGANIC LIGHT EMITTING DIODE DISPLAY

BACKGROUND

1. Field

Embodiments relate to an organic light emitting diode (OLED) display.

2. Description of the Related Art

An organic light emitting diode (OLED) display is a self emissive display device that displays images with organic light emitting diodes. Electrons and holes are combined with each other in an organic emissive layer to thereby generate excitons. When the excitons shift from the excited state to the ground state, energy is generated so as to emit light, and images are displayed on the basis of the emitted light.

The OLED display may use a low temperature polycrystalline silicon thin film transistor (LTPS TFT) having excellent carrier mobility. However, the LTPS TFT may be manufactured through a relatively complex manufacturing process compared to an amorphous silicon TFT. The amorphous silicon TFT may be advantageous for a large-area process because a complicated crystallization process may be omitted. That is, productivity of the OLED display including the LTPS TFT may be deteriorated as a size of the display is increased.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode (OLED) display, which substantially overcome one or more of the problems due to the limitations and disadvantages of the related art.

It is a feature of an embodiment to provide an organic light emitting diode (OLED) display that can be effectively increased in size.

At least one of the above and other features and advantages may be realized by providing an organic light emitting diode (OLED) display including a substrate main body; a thin film transistor on the substrate main body; and an organic light emitting diode including a transparent electrode connected with the thin film transistor and being capable of injecting electrons, an organic emission layer on the transparent electrode, and a reflective electrode on the organic emission layer and being capable of injecting holes, wherein the organic emission layer includes an electron injection unit on the transparent electrode, the electron injection unit including an electron injection metal layer, an electron injection layer, and an electron injection dipole layer, and a light emitting unit on the electron injection unit.

The thin film transistor may be an N-type thin film transistor.

The thin film transistor may be an amorphous silicon thin film transistor.

The transparent electrode may have a work function greater than about 4.5 eV.

The transparent electrode may include at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The reflective electrode may have a work function lower than about 4.5 eV.

The electron injection metal layer may have a work function lower than about 4.5 eV.

At least one of the reflective electrode and the electron injection metal layer may include at least one of silver (Ag), lithium (Li), magnesium (Mg), calcium (Ca), zinc (Zn), and aluminum (Al).

The electron injection dipole layer may include at least one of fullerene (C60), fluorinated copper-phthalocyanine (F16CuPc), tetracyanoquinodimethane (TCNQ), 11,11,12,12-tetracyano-1,4-naphthaquinodimethane (TCNNQ), perylene tetracarboxylic diimide (PTCDI), 1,4;5,8-naphthalene-tetracarboxylic diimide (NTCDI), and 1,4,5,8-naphthalene-tetracarboxylic-dianhydride (NTCDA).

The electron injection metal layer, the electron injection layer, and the electron injection dipole layer may be sequentially stacked on the transparent electrode.

The electron injection layer and the electron injection dipole layer may be integrally formed with one another.

The OLED display may further include an electron transport layer between the electron injection unit and the light emitting unit.

The organic emission layer may further include a hole injection unit, the hole injection unit including a hole injection layer and a hole injection dipole layer and being disposed between the light emitting unit and the reflective electrode.

The hole injection dipole layer may include at least one of fullerene (C60), fluorinated copper-phthalocyanine (F16CuPc), tetracyanoquinodimethane (TCNQ), 11,11,12,12-tetracyano-1,4-naphthaquinodimethane (TCNNQ), perylene tetracarboxylic diimide (PTCDI)-4;5,8-naphthalene-tetracarboxylic diimide (NTCDI 1), and 1,4,5,8-naphthalene-tetracarboxylic-dianhydride (NTCDA).

The OL hole injection dipole layer may include a metal oxidation layer having a dipole characteristic.

The metal oxidation layer having the dipole characteristic may include at least one of molybdenum oxide, tungsten oxide, vanadium oxide, rhenium oxide, and ruthenium oxide.

The hole injection dipole layer and the hole injection layer may be sequentially stacked on the light emitting unit.

The hole injection layer and the hole injection dipole layer may be integrally formed with one another.

The OLED display may further include a hole transport layer between the hole injection unit and the light emitting unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
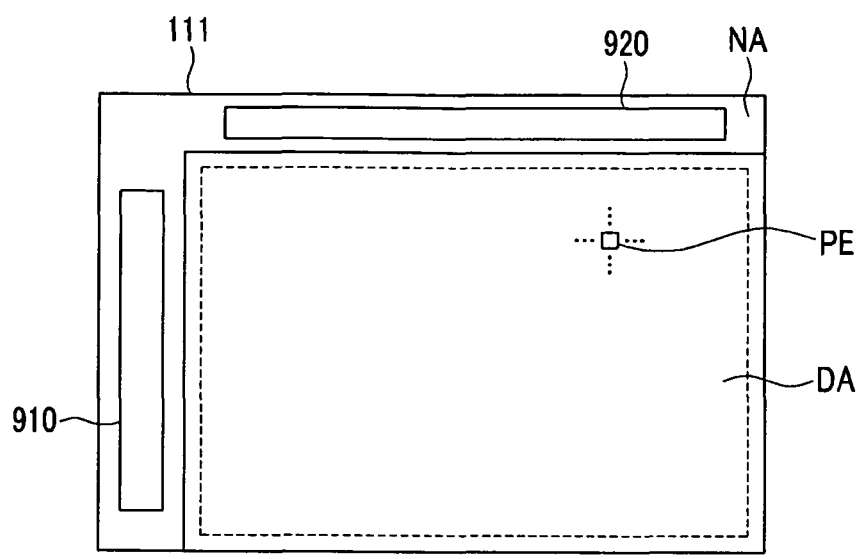
FIG. 1 illustrates is a top plan view of a structure of an organic light emitting diode (OLED) display according to an embodiment.

Korean Patent Application No. 10-2010-0029419, filed on Mar. 31, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, referring to FIG. 1 to FIG. 3, an organic light emitting diode (OLED) display 101 according to an embodiment will be described.

As illustrated in FIG. 1, the OLED display 101 may include a substrate main body 111 divided into a display area DA and a non-display area NA. A plurality of pixel areas PE may display an image in the display area DA of the substrate main body 111. One or more driving circuits 910 and 920 may be formed in the non-display area NA. Here, the pixel area PE may be an area where a pixel, which is the minimum unit for displaying an image, is formed. However, it is not necessary for all the driving circuits 910 and 920 to be formed in the non-display area NA according to an embodiment, and the driving circuits 910 and 920 may be partially or entirely omitted.

Figure 2:
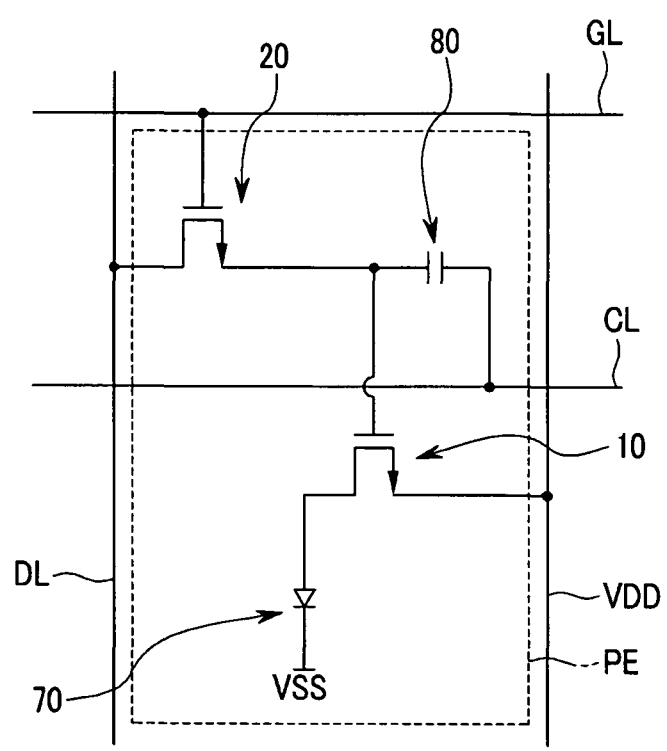
FIG. 2 illustrates a circuit diagram of a pixel circuit of the OLED display of FIG. 1.
Figure 3:
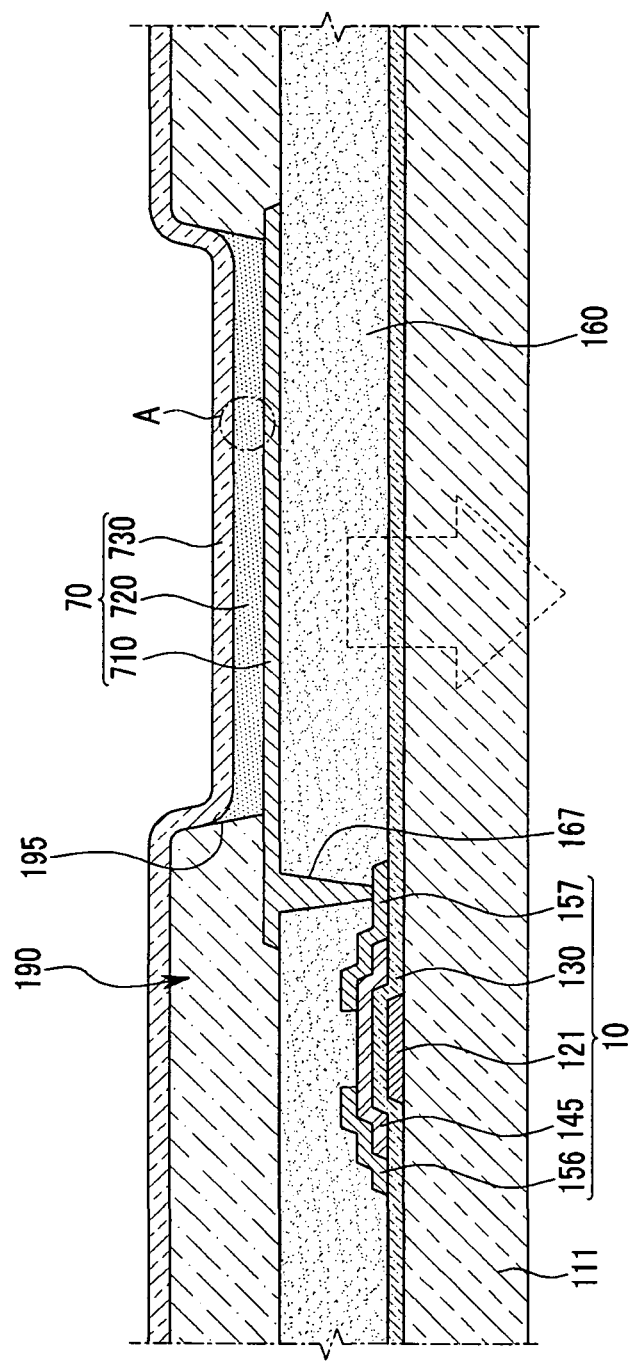
FIG. 3 illustrates a partial cross-sectional view of a thin film transistor and an organic light emitting element of the OLED display of FIG. 1.

As illustrated in FIG. 2, the OLED display 101 according to an embodiment may have a structure in which one pixel PE has a 2Tr-1Cap structure with an organic light emitting diode 70, two thin film transistors (TFTs) 10 and 20, and a capacitor 80. However, the embodiments are not limited thereto. That is, the OLED display 101 may be variously structured such that three or more thin film transistors and two or more capacitors are provided at one pixel PE together with a separate wire. The additional thin film transistor and capacitors may form a compensation circuit.

The compensation circuit may improve uniformity of the organic light emitting diode 70 formed at each pixel PE and may prevent image quality from being deviated. The compensation circuit may include two to eight thin film transistors.

In addition, the driving circuits 910 and 920 (illustrated in FIG. 1) in the non-display area NA of the substrate main body 111 may include additional thin film transistors.

The organic light emitting diode 70 may include an anode being a hole injection electrode, a cathode being an electron injection electrode, and an organic emissive layer between the anode and the cathode.

In further detail, in an embodiment, the OLED display 101 may include a first thin film transistor 10 and a second thin film transistor 20 for each pixel area PE. The first thin film transistor 10 and the second thin film transistor 20 may respectively include a gate electrode, a polycrystalline semiconductor layer, a source electrode, and a drain electrode. In addition, the first thin film transistor 10 and the second thin film transistor 20 may respectively include polycrystalline semiconductor layers that are crystallized by different methods.

FIG. 2 illustrates a gate line (GL), a data line (DL), a common power line VDD, and a capacitor line CL, but the embodiments are not limited to the structure illustrated in FIG. 2. Therefore, the capacitor line (CL) may be omitted as desired.

The data line DL may be coupled with a source electrode of the second thin film transistor 20, and the gate line GL may be coupled with a gate electrode of the second thin film transistor 20. In addition, a drain electrode of the second thin film transistor 20 may be coupled with the capacitor line CL through the capacitor 80. A node may be formed between the drain electrode of the second thin film transistor 20 and the capacitor 80, and the gate electrode of the first thin film transistor 10 may be connected thereto. The drain electrode of the first thin film transistor 10 may be connected with the common power line VDD, and the source electrode of the first thin film transistor 10 may be connected with an anode of the organic light emitting diode 70.

The second thin film transistor 20 may be used as a switch for selecting a pixel area PE for light emission. When the second thin film transistor 20 is turned on, the capacitor 80 may be instantly charged. At this time, the amount of the charge may be proportional to a potential of voltage applied from the data line DL. When the second thin film transistor 20 turns off and signals are input into the capacitor line CL while increasing the voltage by a cycle of one frame, the gate potential of the first thin film transistor 10 may be increased along with the voltage applied through the capacitor line CL, based on the potential of the capacitor 80. When the gate potential of the first thin film transistor 10 goes over the threshold voltage, the first thin film transistor 10 may turn on. Then, the voltage applied to the common power line VDD may be applied to the organic light emitting diode 70 through the first thin film transistor 10 so that the organic light emitting diode 70 emits light.

The structure of the pixel PE is not limited to as above-described, but may be variously modified provided that such modifications can be easily appreciated and made by a person skilled in the art.

Hereinafter, referring to FIG. 3, structures of the first thin film transistor 10 and the organic light emitting diode 70 according to an embodiment will be described in further detail.

The substrate main body 111 may be formed with a transparent insulating substrate made of, e.g., glass, quartz, or ceramic, or may be formed with a transparent flexible substrate made of, e.g., plastic.

A gate electrode 121 may be formed on the substrate main body 111. The gate electrode 121 may include, e.g., molybdenum (Mo), chromium (Cr), aluminum (Al), silver (Ag), titanium (Ti), tantalum (Ta), and/or tungsten (W). However, the embodiments are not limited thereto. The gate electrode 121 may be made of various metals having excellent electrical characteristics.

Although not illustrated, a buffer layer may be formed between the substrate main body 111 and the gate electrode 121. For example, the buffer layer may be formed as a single-layered structure based on silicon nitride ($SiN_x$), or a double-layered structure based on silicon nitride ($SiN_x$) and silicon oxide ($SiO_2$). The buffer layer may prevent unneeded components, e.g., impure elements or moisture, from intruding into the device, while also flattening the surface thereof. However, the buffer layer may be omitted depending upon the kind and processing conditions of the substrate main body 111.

A gate insulating layer 130 may be formed on the gate electrode 121. The gate insulating layer 130 may include, e.g., tetraethoxysilane (TEOS), silicon nitride ($SiN_x$), and/or silicon oxide ($SiO_2$). In an implementation, the gate insulating layer 130 may be formed as a double-layered structure sequentially having a silicon nitride layer with a thickness of about 40 nm and a tetraethoxysilane layer with a thickness of about 80 nm.

An amorphous semiconductor layer 145 may be formed on the gate insulating layer 130. The amorphous semiconductor layer 145 may be formed with amorphous silicon. In addition, a source electrode 156 and a drain electrode 157 respectively connected to a part of the amorphous semiconductor layer 145 may be formed on the amorphous semiconductor layer 145. The source electrode 156 and the drain electrode 157 may be spaced apart from each other.

Like the gate electrode 121, the source electrode 156 and the drain electrode 157 may include, e.g., molybdenum (Mo), chromium (Cr), aluminum(Al), silver (Ag), titanium (Ti), tantalum (Ta), and/or tungsten (W).

As described, the first thin film transistor 10 may be an amorphous silicon thin film transistor including the gate electrode 121, the amorphous semiconductor layer 145, the source electrode 156, and the drain electrode 157. In an implementation, the first thin film transistor 10 may be an N-type thin film transistor.

A planarization layer 160 may be formed on the source electrode 156 and the drain electrode 157. The planarization layer 160 may include a contact hole 167 that partially exposes the drain electrode 157. The planarization layer 160 may be formed with an organic layer having a planarization characteristic. The planarization layer 160 may be omitted as desired.

A transparent electrode 710 may be formed on the planarization layer 160. The transparent electrode 710 may be an electron injection electrode that injects electrons into an organic emission layer 720. The transparent electrode 710 may include, e.g., indium tin oxide (ITO), indium zinc oxide (IZO), zinc indium tin oxide (ZITO), gallium indium tin oxide (GITO), indium Oxide ($In_2O_3$), zinc oxide (ZnO), gallium indium zinc oxide (GIZO), gallium zinc oxide (GZO), fluorine tin oxide (FTO), and/or aluminum-doped zinc oxide (AZO).

A pixel definition layer 190 having an opening 195 that exposes at least a part of the transparent electrode 710 may be formed on the planarization layer 160. The opening 195 of the pixel definition layer 190 may define a light emission area where light is generated.

The organic emission layer 720 may be formed on the transparent electrode 710. A reflective electrode 730 may be formed on the organic emission layer 720. The reflective electrode 730 may be a hole injection electrode that injects holes to the organic emission layer 720. Thus, it may be advantageous to make the reflective electrode 730 with a material having a high work function. In an implementation, the hole injection electrode may be made of, e.g., nickel (N), molybdenum (Mo), gold (Au), platinum (Pt), tungsten (W), and/or copper (Cu), that have a work function higher than about 4.5 eV.

However, according to the present embodiment, with a hole injection unit 725 (see FIG. 4), the reflective electrode 730 used as the hole injection electrode may be effectively formed from a metal having a relatively low work function. In further detail, the reflective electrode 730 may be formed with a metal having a work function lower than about 4.5 eV in the present embodiment.

With such a structure, light generated from the organic emission layer 720 may pass through the transparent electrode 710 and may then be emitted to the outside. That is, the OLED display 101 according to the present embodiment may be a rear emission type that displays an image by emitting light in a rearward direction. FIG. 3 illustrates a light emission direction with a dotted arrow.

Although not illustrated, the OLED display 101 may further include an encapsulation member. The encapsulation member may be an encapsulation substrate arranged opposite to the substrate main body 111 and may cover the organic light emitting diode 70. The encapsulation substrate may be sealed with the substrate main body 111 through a sealant along an edge thereof. Alternatively, an encapsulation thin film may be used as the encapsulation member.

In order to form the rear emission OLED display 101, the transparent electrode 710 may be connected with the drain electrode 157 of the first thin film transistor 10. In addition, since the first thin film transistor 10 may be an N-type thin film transistor, the transparent electrode 710 may function as an electron injection electrode.

However, transparent oxides used as materials of the transparent electrode 710 may have a relatively high work function. In further detail, the transparent electrode 710 may have a work function greater than about 4.5 eV. Thus, the transparent electrode 710 may not smoothly perform electron injection by itself.

Figure 4:
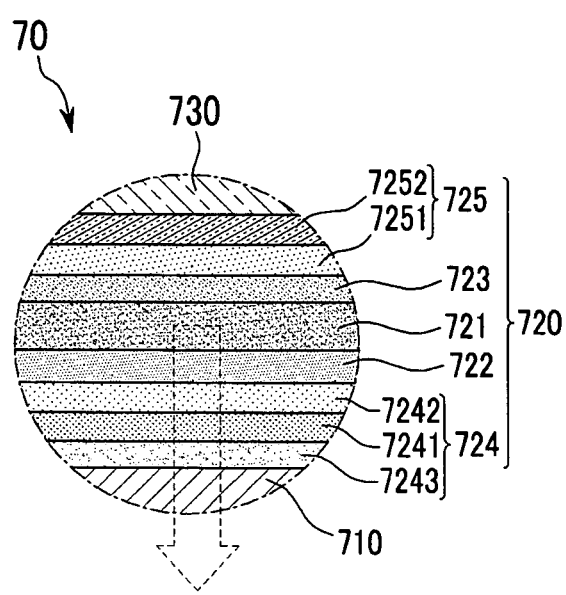
FIG. 4 illustrates a partial cross-sectional view of the organic light emitting element of FIG. 3.

Therefore, as illustrated in FIG. 4, the organic emission layer 720 may include an electron injection unit 724 that may facilitate smooth electron injection through the transparent electrode 710. In the present embodiment, the electron injection unit 724 may include an electron injection metal layer 7243 and an electron injection dipole layer 7242 in addition to an electron injection layer (EIL) 7241.

The electron injection metal layer 7243 may be formed on the transparent electrode 710. The electron injection metal layer 7243 may have a work function lower than about 4.5 eV. It may be further effective when the work function of the electron injection metal layer 7243 is lower than about 4.0 eV. That is, it is preferred that the electron injection metal layer 7243 has a lower work function. The electron injection metal layer 7243 may include, e.g., silver (Ag), lithium (Li), magnesium (Mg), calcium (Ca), zinc (Zn), and/or aluminum (Al).

The electron injection layer (EIL) 7241 may be formed on the electron injection metal layer 7243. An electron injection layer (EIL) known to a person skilled in the art may be used as the electron injection layer (EIL) 7241. For example, the electron injection layer (EIL) may be made of a material such as LiF or lithium quinolate (LiQ).

The electron injection dipole layer 7242 may be formed on the electron injection layer (EIL) 7241. The electron injection dipole layer 7242 may include, e.g., fullerene (C60), fluorinated copper-phthalocyanine (F16CuPc), tetracyanoquinodimethane (TCNQ), 11,11,12,12-tetracyano-1,4-naphthaquinodimethane (TCNNQ), perylene tetracarboxylic diimide (PTCDI), 1,4;5,8-naphthalene-tetracarboxylic diimide (NTCDI), and/or 1,4,5,8-naphthalene-tetracarboxylic-dianhydride (NTCDA).

However, the embodiments are not limited thereto. That is, the electron injection dipole layer 7242 and the electron injection layer (EIL) 7241 may be integrally formed with one another. In other words, the electron injection dipole layer 7242 and the electron injection layer (EIL) 7241 may be formed as a single layer.

The organic emission layer 720 may further include an electron transport layer (ETL) 722, a light emitting unit 721, a hole transport layer (HTL) 723, and the hole injection unit 725 that are sequentially disposed on the electron injection unit 724.

The electron transport layer (ETL) 722 may be disposed on the electron injection dipole layer 7242. The electron transport layer (ETL) 722 may be omitted as desired. An electron transport layer (ETL) known to a person skilled in the art may be used as the electron transport layer (ETL) 722. For example, the electron transport layer (ETL) 722 may be formed with an aryl compound such as an oxadiazole, a triazole, a phenanthroline, a benzoxazole, and/or a benzothiazole.

The light emitting unit 721 may be disposed on the electron transport layer (ETL) 722. The light emitting unit 721 may be made of an organic emission material known to a person skilled in the art.

In the present embodiment, with the electron injection dipole layer 7242, electron injection may be smoothly performed without regard to an energy level of the light emitting unit 721.

The hole transport layer (HTL) 723 may be disposed on the light emitting unit 721. The hole transport layer (HTL) 723 may be omitted as desired. A hole transport layer (HTL) known to a person skilled in the art may be used as the hole transport layer (HTL) 723. For example, the hole transport layer (HTL) 723 may be made of a material such as TPD (N,N'-diphenyl-N,N'-bis (3-methylphenyl)-1,1'-bi-phenyl-4, 4'-diamine) and/or NPB (N,N'-di(naphthalen-1-yl)-N,N'-diphenyl-benzidine).

The hole injection unit 725 may include a hole injection dipole layer 7251 formed on the hole transport layer (HTL) 723 and a hole injection layer 7252 formed on the hole injection dipole layer 7251.

The hole injection dipole layer 7251 may include, e.g., C60 (fullerene), F16CuPc (fluorinated copper-phthalocyanine), TCNQ (tetracyanoquinodimethane), TCNNQ (11,11,12,12-tetracyano-1,4-naphthaquinodimethane), PTCDI (perylene tetracarboxylic diimide), NTCDI (1,4;5,8-naphthalene-tetracarboxylic diimide), and/or NTCDA (1,4,5,8-naphthalene-tetracarboxylic-dianhydride).

Alternatively, the hole injection dipole layer 7251 may include a metal oxidation layer having a dipole characteristic. The metal oxidation layer having the dipole characteristic may include, e.g., molybdenum oxide, tungsten oxide, vanadium oxide, rhenium oxide, and/or ruthenium oxide.

A hole injection layer (HIL) known to a person skilled in the art may be used as the hole injection layer (HIL) 7252. For example, the hole injection layer (HIL) 7252 may be made of a material such as MTDATA (4,4',4"-tris (3-methylphenylphenylamino)triphenylamine), CuPc (copper phthalocyanine), and/or PEDOT/PSS (poly(3,4-ethylenedioxythiphene, polystyrene sulfonate).

However, the embodiments are not limited thereto. That is, the hole injection dipole layer 7251 and the hole injection layer (HIL) 7252 may be integrally formed. In other words, the hole injection dipole layer 7251 and the hole injection layer (HIL) 7252 may be formed as a single layer The reflective electrode 730 may be formed on the hole injection layer (HIL) 7252.

With such a configuration, the organic light emitting diode 70 may be effectively driven using the amorphous silicon thin film transistor that is appropriate for a large-area process. Thus, the OLED display 101 may be be effectively increased in size with the rear emission type of structure.

In further detail, electron and hole injection to the light emitting unit 721 may be smoothly performed while using the transparent electrode 710 coupled with the drain electrode 157 of the N-type first thin film transistor 10 as an electron injection electrode and the reflective electrode 730 as a hole injection electrode.

That is, through the electron injection unit 724 and the hole injection unit 725 according to the present embodiment, the transparent electrode 710 that has been used as a hole injection electrode may be used as an electron injection electrode, and the reflective electrode 730 that has been used as an electron injection electrode may be used as a hole injection electrode.

In addition, according to the present embodiment, a transparent conductive layer, e.g., ITO, may not be formed on the organic emission layer 720. Therefore, damage to the organic emission layer during an ITO forming process may be prevented. In particular, when a transparent conductive layer such as ITO is formed on the organic emission layer 720 using a sputtering method, the organic emission layer 720 may be easily damaged.

Hereinafter, an Experimental Example and Comparative Examples will be described with reference to FIG. 5 and FIG. 6.

The Experimental Example used an OLED display driving an organic light emitting element formed according to an embodiment with an amorphous thin film transistor.

Comparative Example 1 used a rear emission type of OLED display that drives an organic light emitting diode with a low temperature polycrystalline silicon thin film transistor. The organic light emitting element included an anode made of ITO, a hole injection layer (HIL) made of CuPc, a hole transport layer made of NPB, a typical light emitting unit, an electron transport layer (ETL) made of $BeBq_2$(bis(benzoquinoline)beryllium), an electron injection layer made of LiF, and a cathode made of Al.

Comparative Example 2 was the same as the Experimental Example in structure except for the electron injection unit. An electron injection unit in Comparative Example 2 included only an electron injection layer. That is, the electron injection unit did not include an electron injection metal layer and an electron injection dipole layer.

Comparative Example 3 was the same as the Experimental Example in structure except for the hole injection unit. The hole injection unit in Comparative Example 3 included only a hole injection layer. That is, the hole injection unit did not include a hole injection dipole layer.

Figure 5:
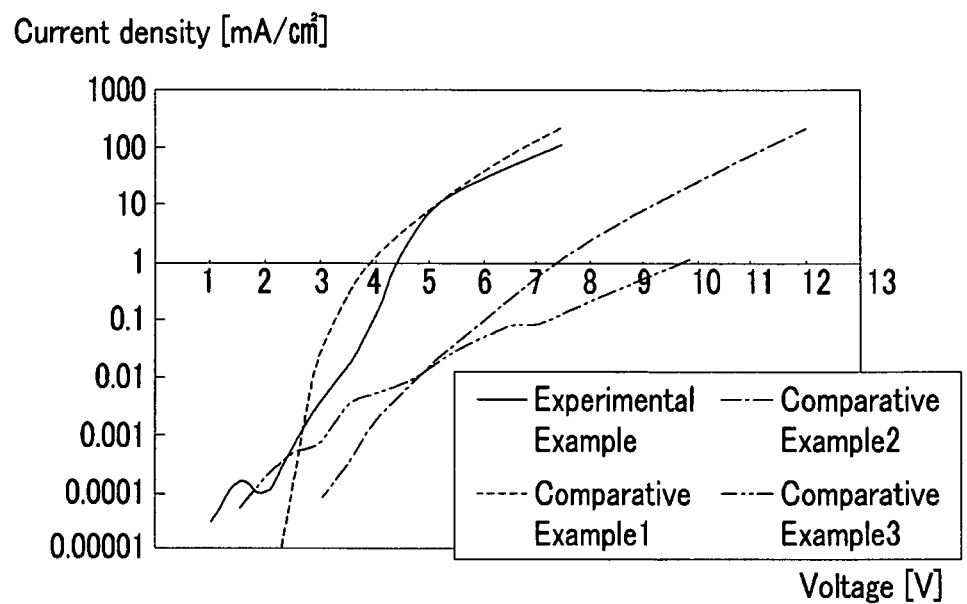
FIG. 5 and FIG. 6 illustrate graphs comparing an Experimental Example and Comparative Examples.

FIG. 5 illustrates a curved line of current (I)-voltage (V). As illustrated in FIG. 5, the Experimental Example using the rear emission type of OLED display to drive the organic light emitting element with the amorphous silicon thin film transistor was not significantly different from Comparative Example 1 using the typical rear emission type OLED display.

However, when an organic light emitting element not formed according to an embodiment was driven by the amorphous silicon thin film transistor, significant deterioration of the characteristic of the OLED display was observed through Comparative Example 2 and Comparative Example 3.

Figure 6:
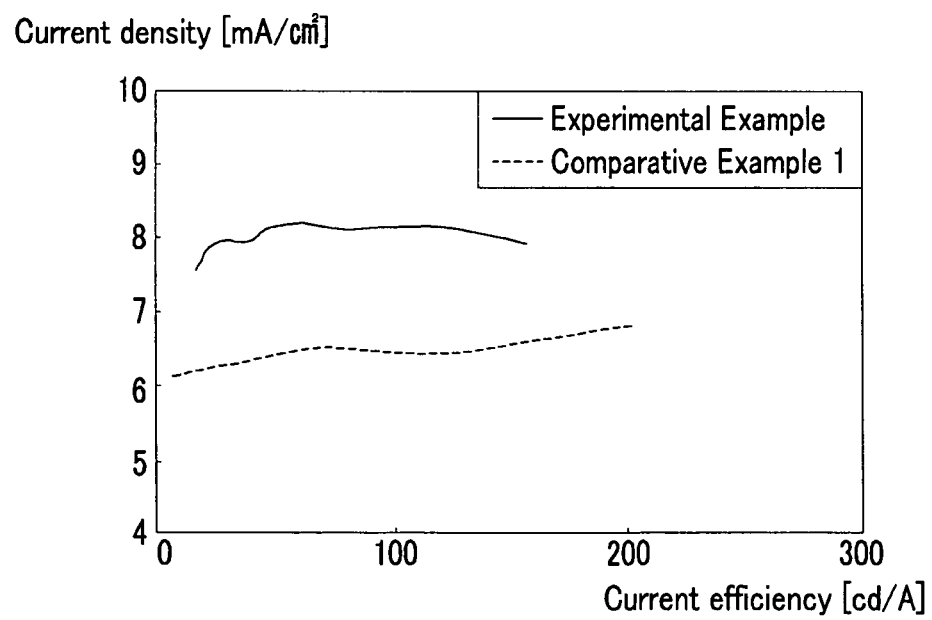

FIG. 6 illustrates a curved line of current efficiency (CE)-current density (J). As shown in FIG. 6, the Experimental Example exhibited current efficiency that was improved more than 30% compared to that of Comparative Example 1.

Through the experiments, the rear emission type of OLED display using the amorphous silicon thin film transistor that is advantageous to a large-area process may exhibit a similar or improved characteristic compared to a typical rear emission type of OLED display.

Therefore, according to an embodiment, the size of the OLED display may be increased in an effective matter through use of an amorphous silicon thin film transistor advantageous for a large-area process. This may be achieved without suffering the low electron mobility usually associated with amorphous silicon thin film transistors, which, being an N-type thin film transistor, may exhibit deterioration of the efficiency and durability of the organic light emitting element connected with the amorphous silicon thin film transistor.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a substrate main body;
    a thin film transistor on the substrate main body; and
    an organic light emitting diode including a transparent electrode connected with the thin film transistor and being capable of injecting electrons, an organic emission layer on the transparent electrode, and a reflective electrode on the organic emission layer and being capable of injecting holes,
    wherein the organic emission layer includes:
        an electron injection unit on the transparent electrode, the electron injection unit including an electron injection metal layer on the transparent electrode, an electron injection layer, and an electron injection dipole layer,
        a light emitting unit on the electron injection unit,
        a hole injection unit between the light emitting unit and the reflective electrode, the hole injection unit including a hole injection dipole layer on the light emitting unit and a hole injection layer on the hole injection dipole layer, and
        a hole transport layer between the hole injection unit and the light emitting unit,
    wherein the electron injection layer is between the electron injection metal layer and the electron injection dipole layer, and
    wherein the hole injection dipole layer is between the hole injection layer and the hole transport layer.

2. The OLED display as claimed in claim 1, wherein the thin film transistor is an N-type thin film transistor.

3. The OLED display as claimed in claim 2, wherein the thin film transistor is an amorphous silicon thin film transistor.

4. The OLED display as claimed in claim 1, wherein the transparent electrode has a work function greater than about 4.5 eV.

5. The OLED display as claimed in claim 4, wherein the transparent electrode includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

6. The OLED display as claimed in claim 4, wherein the reflective electrode has a work function lower than about 4.5 eV.

7. The OLED display as claimed in claim 1, wherein the electron injection metal layer has a work function lower than about 4.5 eV.

8. The OLED display as claimed in claim 1, wherein at least one of the reflective electrode and the electron injection metal layer includes at least one of silver (Ag), lithium (Li), magnesium (Mg), calcium (Ca), zinc (Zn), and aluminum (Al).

9. The OLED display as claimed in claim 1, wherein the electron injection dipole layer includes at least one of fullerene ($C_{60}$), fluorinated copper-phthalocyanine ($F_{16}CuPc$), tetracyanoquinodimethane (TCNQ), 11,11,12,12-tetracyano-1,4-naphthaquinodimethane (TCNNQ), perylene tetracarboxylic diimide (PTCDI), 1,4;5,8-naphthalene-tetracarboxylic diimide (NTCDI), and 1,4,5,8-naphthalene-tetracarboxylic-dianhydride (NTCDA).

10. The OLED display as claimed in claim 1, further comprising an electron transport layer between the electron injection unit and the light emitting unit.

11. The OLED display as claimed in claim 1, wherein the hole injection dipole layer includes at least one of fullerene ($C_{60}$), fluorinated copper-phthalocyanine ($F_{16}CuPc$), tetracyanoquinodimethane (TCNQ), 11,11,12,12-tetracyano-1,4-naphthaquinodimethane (TCNNQ), perylene tetracarboxylic diimide (PTCDI), 4;5,8-naphthalene-tetracarboxylic diimide (NTCDI 1), and 1,4,5,8-naphthalene-tetracarboxylic-dianhydride (NTCDA).

12. The OLED display as claimed in claim 1, wherein the hole injection dipole layer includes a metal oxidation layer having a dipole characteristic.

13. The OLED display as claimed in claim 12, wherein the metal oxidation layer having the dipole characteristic includes at least one of molybdenum oxide, tungsten oxide, vanadium oxide, rhenium oxide, and ruthenium oxide.

14. The OLED display as claimed in claim 1, wherein the electron injection dipole layer includes at least one of fluorinated copper-phthalocyanine ($F_{16}CuPc$), tetracyanoquinodimethane (TCNQ), 11,11,12,12-tetracyano-1,4-naphthaquinodimethane (TCNNQ), perylene tetracarboxylic diimide (PTCDI), 1,4;5,8-naphthalene-tetracarboxylic diimide (NTCDI), and 1,4,5,8-naphthalene-tetracarboxylic-dianhydride (NTCDA).

15. The OLED display as claimed in claim 1, wherein the hole injection dipole layer includes at least one of fullerene ($C_{60}$), fluorinated copper-phthalocyanine ($F_{16}CuPc$), tetracyanoquinodimethane (TCNQ), 11,11,12,12-tetracyano-1,4-naphthaquinodimethane (TCNNQ), perylene tetracarboxylic diimide (PTCDI), and 4;5,8-naphthalene-tetracarboxylic diimide (NTCDI 1).

16. The OLED display as claimed in claim 12, wherein the metal oxidation layer having the dipole characteristic includes at least one of tungsten oxide, rhenium oxide, and ruthenium oxide.

* * * * *